(12) United States Patent
Huang et al.

(10) Patent No.: US 9,329,501 B2
(45) Date of Patent: May 3, 2016

(54) LITHOGRAPHIC APPARATUS, METHOD OF DEFORMING A SUBSTRATE TABLE AND DEVICE MANUFACTURING METHOD

(75) Inventors: Yang-Shan Huang, Veldhoven (NL); Hans Butler, Best (NL); Jan Van Eijk, Eindhoven (NL); Sven Antoin Johan Hol, Eindhoven (NL); Engelbertus Antonius Fransiscus Van Der Pasch, Oirschot (NL); Bastiaan Lambertus Wilhelmus Marinus Van De Ven, Rosmalen (NL); Johannes Petrus Martinus Bernardus Vermeulen, Helmond (NL); Theodorus Petrus Maria Cadee, Asten (NL); Robbert Edgar Van Leeuwen, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 830 days.

(21) Appl. No.: 13/494,638

(22) Filed: Jun. 12, 2012

(65) Prior Publication Data
US 2012/0327386 A1   Dec. 27, 2012

Related U.S. Application Data

(60) Provisional application No. 61/499,263, filed on Jun. 21, 2011.

(51) Int. Cl.
*G03B 27/58* (2006.01)
*G03F 7/20* (2006.01)

(52) U.S. Cl.
CPC .......... *G03F 7/7085* (2013.01); *G03F 7/70783* (2013.01)

(58) Field of Classification Search
CPC ... G06F 7/7085; G06F 7/70783; G06F 7/707; G06F 7/70775; G06F 7/706; G06F 7/70058; G06F 7/70725; G06F 7/70141; G06F 7/70258; G06F 7/70716; G06F 9/7026; G06F 9/7034; G06F 7/20; G06F 7/70266; G06F 7/703; G06F 7/24; G06F 7/70708
USPC ................................................ 355/53, 72, 77
See application file for complete search history.

(56) References Cited

U.S. PATENT DOCUMENTS 4,475,223 A * 10/1984 Taniguchi et al. ............. 378/34
5,737,064 A *  4/1998 Inoue et al. .................... 355/73

(Continued)

FOREIGN PATENT DOCUMENTS

JP     H11-087228      3/1999
JP     2002-319541     10/2002

(Continued)

*Primary Examiner* — Mesfin T Asfaw
(74) *Attorney, Agent, or Firm* — Pillsbury Winthrop Shaw Pittman LLP

(57) ABSTRACT

A lithographic apparatus includes a projection system, a substrate table, a plurality of sensors, an actuator and a controller. The projection system is configured to project a patterned beam of radiation onto a substrate. The substrate table is configured to support the substrate and to move relative to the projection system. The plurality of sensors is configured to measure a deformation of the substrate table. The actuator is configured to deform the substrate table. The controller is configured to control the actuator to deform the substrate table based on measurements made by the sensors. The plurality of sensors is located on a first side of the substrate table opposite to a second side of the substrate table facing the projection system. The plurality of sensors is substantially stationary relative to the projection system.

19 Claims, 4 Drawing Sheets

(56) References Cited

U.S. PATENT DOCUMENTS

| | | |
|---|---|---|
| 7,440,081 B2 | 10/2008 | Gui et al. |
| 7,576,832 B2 | 8/2009 | Kamidi et al. |
| 2004/0207824 A1 | 10/2004 | Lof et al. |
| 2004/0233404 A1* | 11/2004 | Hayashi .................. 355/53 |
| 2006/0098176 A1 | 5/2006 | Gui et al. |
| 2007/0146679 A1* | 6/2007 | Sutedja et al. ............ 355/72 |
| 2007/0258079 A1 | 11/2007 | Kamidi et al. |
| 2009/0122284 A1* | 5/2009 | Butler et al. ............. 355/53 |
| 2010/0157276 A1 | 6/2010 | Shibazaki |
| 2011/0007291 A1* | 1/2011 | Ichinose ................. 355/67 |

FOREIGN PATENT DOCUMENTS

| | | |
|---|---|---|
| JP | 2005-079373 | 3/2005 |
| JP | 2006-100747 | 4/2006 |
| JP | 2006-146195 | 6/2006 |
| JP | 2007-048956 | 2/2007 |
| JP | 2007-318107 | 12/2007 |
| WO | 2010/071240 | 6/2010 |

* cited by examiner

LITHOGRAPHIC APPARATUS, METHOD OF DEFORMING A SUBSTRATE TABLE AND DEVICE MANUFACTURING METHOD

CROSS REFERENCE TO RELATED APPLICATIONS

This application claims priority and benefit under 35 U.S.C. §119(e) to U.S. Provisional Patent Application Ser. No. 61/499,263, entitled "Lithographic Apparatus, Method of Deforming a Substrate Table and Device Manufacturing Method," filed on Jun. 21, 2011, the content of which is incorporated herein in its entirety by reference.

FIELD

The present invention relates to a lithographic apparatus, a method of deforming a substrate table and a device manufacturing method.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. In an embodiment, the liquid is distilled water, although another liquid can be used. An embodiment of the present invention will be described with reference to liquid. However, another fluid may be suitable, particularly a wetting fluid, an incompressible fluid and/or a fluid with higher refractive index than air, desirably a higher refractive index than water. Fluids excluding gases are particularly desirable. The point of this is to enable imaging of smaller features since the exposure radiation will have a shorter wavelength in the liquid. (The effect of the liquid may also be regarded as increasing the effective numerical aperture (NA) of the system and also increasing the depth of focus.) Other immersion liquids have been proposed, including water with solid particles (e.g. quartz) suspended therein, or a liquid with a nano-particle suspension (e.g. particles with a maximum dimension of up to 10 nm). The suspended particles may or may not have a similar or the same refractive index as the liquid in which they are suspended. Other liquids which may be suitable include a hydrocarbon, such as an aromatic, a fluorohydrocarbon, and/or an aqueous solution.

The substrate is supported by a substrate table. The position of the substrate is controlled to a desired accuracy. Generally, the substrate table moves during use of the lithographic apparatus due to movement of other components in the apparatus. Vibrations within the apparatus can be of the order of the desired accuracy. Therefore, it is a non-trivial problem to control the substrate table to the desired accuracy.

US 2010/0157276 A1 discloses a lithographic apparatus that has, above the substrate table, a metrology frame connected to the projection system. A measurement bar is connected to the metrology frame and extends beneath the substrate table. The end of the measurement bar is positioned directly beneath the projection system and supports an encoder system. The encoder system measures the position of the substrate table at the optical axis by using an encoder grid on the bottom side of the measurement target.

SUMMARY

It is desirable, for example, to further improve the control of the substrate table of a lithographic apparatus.

According to an aspect of the invention, there is provided a lithographic apparatus, comprising a projection system, a substrate table, a plurality of sensors, at least one actuator and a controller. The projection system is for projecting a patterned beam of radiation onto a substrate. The substrate table is configured to support the substrate and to move relative to the projection system. The plurality of sensors is configured to measure a deformation of the substrate table. The at least one actuator is configured to deform the substrate table. The controller is configured to control the actuator to deform the substrate table based on measurements made by the sensors. The plurality of sensors is located on a first side of the substrate table opposite to a second side of the substrate table facing the projection system. The plurality of sensors is substantially stationary relative to the projection system.

According to an aspect of the invention, there is provided a method of deforming a substrate table of a lithographic apparatus. The method comprises measuring a deformation of the substrate table at a plurality of measurement locations located on a first side of the substrate table opposite to a second side facing a projection system, the plurality of measurement locations being substantially stationary relative to the projection system; and controlling at least one actuator based on said measurements to deform the substrate table.

According to an aspect of the invention there is provided a device manufacturing method, comprising: using a lithographic apparatus to project a patterned beam of radiation onto successive substrates supported by at least one substrate table; and using the method mentioned above to deform the substrate table during the use of the lithographic apparatus.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
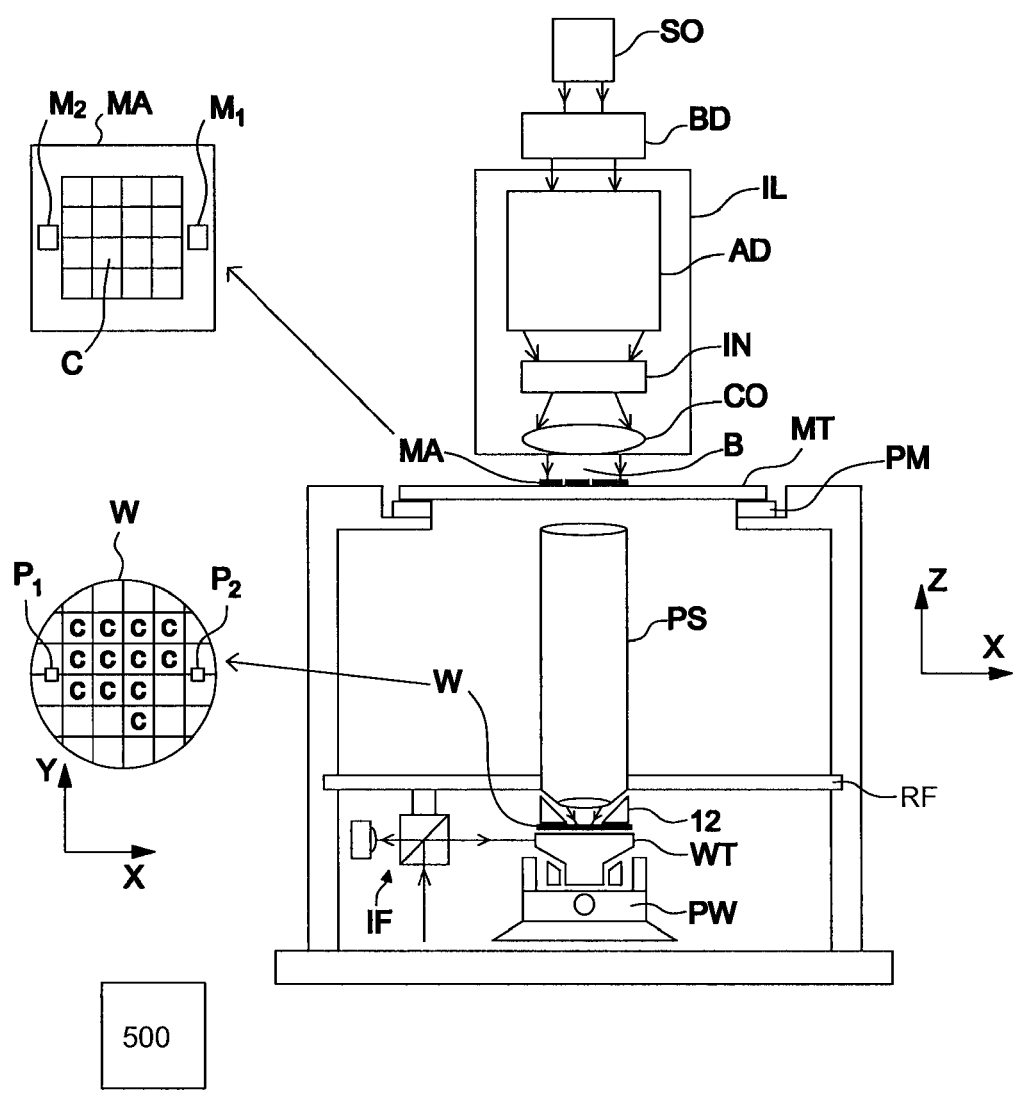
FIG. 1 depicts a lithographic apparatus according to an embodiment of the invention.

FIG. 1 schematically depicts a lithographic apparatus according to one embodiment of the invention. The apparatus comprises:

- an illumination system (illuminator) IL configured to condition a radiation beam B (e.g. UV radiation, DUV radiation or EUV radiation);
- a support structure (e.g. a mask table) MT constructed to support a patterning device (e.g. a mask) MA and connected to a first positioner PM configured to accurately position the patterning device in accordance with certain parameters;
- a substrate table (e.g. a wafer table) WT constructed to hold a substrate (e.g. a resist-coated wafer) W and connected to a second positioner PW configured to accurately position the substrate in accordance with certain parameters; and
- a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device. The support structure MT holds the patterning device in a manner that depends on the orientation of the patterning device, the design of the lithographic apparatus, and other conditions, such as for example whether or not the patterning device is held in a vacuum environment. The support structure MT can use mechanical, vacuum, electrostatic or other clamping techniques to hold the patterning device. The support structure MT may be a frame or a table, for example, which may be fixed or movable as required. The support structure MT may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more patterning device tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD configured to adjust the angular intensity distribution of the radiation beam. Generally, at least the outer and/or inner radial extent (commonly referred to as $\sigma$-outer and $\sigma$-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section. Similar to the source SO, the illuminator IL may or may not be considered to form part of the lithographic apparatus. For example, the illuminator IL may be an integral part of the lithographic apparatus or may be a separate entity from the lithographic apparatus. In the latter case, the lithographic apparatus may be configured to allow the illuminator IL to be mounted thereon. Optionally, the illuminator IL is detachable and may be separately provided (for example, by the lithographic apparatus manufacturer or another supplier).

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

In many lithographic apparatus a fluid, in particular a liquid, is provided between the final element of the projection system to enable imaging of smaller features and/or increase the effective NA of the apparatus. Embodiments of the invention is described further below with reference to such an immersion apparatus, but may equally be embodied in a non-immersion apparatus. Arrangements for providing liquid between a final element of the projection system and the substrate can be classed into at least two general categories. These are the bath type arrangement and the so called localized immersion system. In the bath type arrangement substantially the whole of the substrate and optionally part of the substrate table is submersed in a bath of liquid. The so called localized immersion system uses a liquid supply system in which liquid is only provided to a localized area of the substrate. In the latter category, the space filled by liquid is smaller in plan than the top surface of the substrate and the area filled with liquid remains substantially stationary relative to the projection system while the substrate moves underneath that area. A further arrangement, to which an embodiment of the invention is directed, is the all wet solution in which the liquid is unconfined. In this arrangement substantially the whole top surface of the substrate and all or part of the substrate table is covered in immersion liquid. The depth of the liquid covering at least the substrate is small. The liquid may be a film, such as a thin film, of liquid on the substrate.

Figure 2:
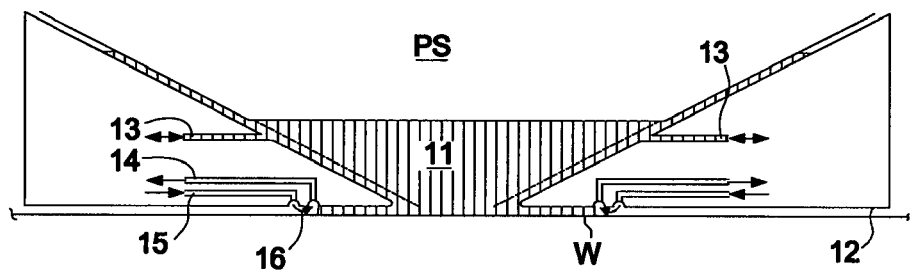
FIG. 2 depicts a liquid supply system for use in a lithographic projection apparatus.

An arrangement which has been proposed is to provide the liquid supply system with a liquid confinement member which extends along at least a part of a boundary of the space between the final element of the projection system and the substrate table. Such an arrangement is illustrated in FIG. 2. The liquid confinement member is substantially stationary relative to the projection system in the XY plane though there may be some relative movement in the Z direction (in the direction of the optical axis). A seal is formed between the liquid confinement and the surface of the substrate. In an embodiment, a seal is formed between the liquid confinement structure and the surface of the substrate and may be a contactless seal such as a gas seal. Such a system is disclosed in United States patent application publication no. US 2004-0207824.

The fluid handling structure 12 at least partly contains liquid in the space 11 between a final element of the projection system PS and the substrate W. A contactless seal 16 to the substrate W may be formed around the image field of the projection system so that liquid is confined within the space between the substrate W surface and the final element of the projection system PS. The space is at least partly formed by the fluid handling structure 12 positioned below and surrounding the final element of the projection system PS. Liquid is brought into the space below the projection system and within the fluid handling structure 12 by liquid inlet 13. The liquid may be removed by liquid outlet 13.

Many other types of liquid supply system are possible. Embodiments of the present invention is not limited to any particular type of liquid supply system, nor to immersion lithography. Embodiments of the invention can be applied equally in any lithography.

A control system or controller 500 controls the overall operations of the lithographic apparatus and in particular performs an optimization process described further below. Control system 500 may be embodied as a suitably-programmed general purpose computer comprising a central processing unit, volatile and non-volatile storage means, input and output devices such as keyboards and screens, connections to networks and interfaces to the various parts of the lithographic apparatus. It will be appreciated that a one-to-one relationship between controlling computer and lithographic apparatus is not necessary. In an embodiment of the invention one computer may control multiple lithographic apparatus. In another embodiment of the invention, multiple networked computers may be used to control one lithographic apparatus. The control system 500 may be configured to control also associated process devices and substrate handling devices in a lithocell or cluster of which the lithographic apparatus forms a part. The control system 500 can also be configured to be subordinate to a supervisory control system of a lithocell or cluster and/or an overall control system of a fab.

Figure 3:
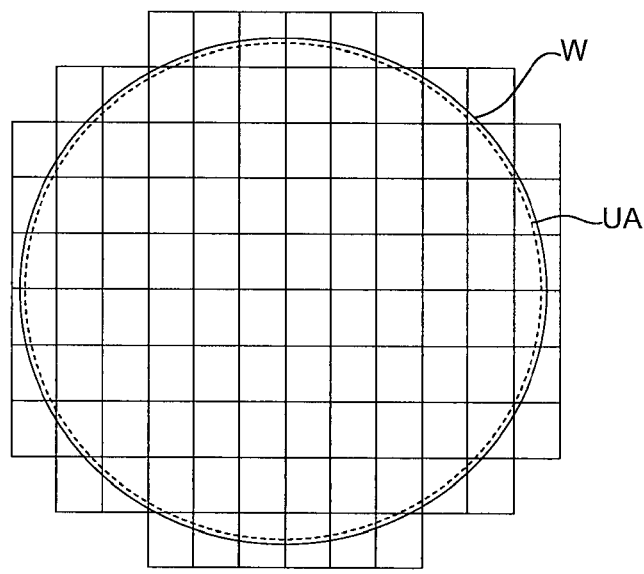
FIG. 3 depicts a circular substrate on which devices are to be formed in a method of an embodiment of the invention.

As shown in FIG. 3, a circular substrate (e.g. wafer) W has a usable area UA slightly smaller than its total surface area, allowing for an edge region that cannot be used to form devices. A standard substrate can have a nominal diameter of 150 mm, 200 mm, 300 mm or 450 mm, for example. At the time of writing, 300 mm is standard for silicon substrates and 450 mm is proposed. Small sizes are used for other semiconductor materials, such as GaAs. Larger sizes have the benefit that each substrate has a greater usable area UA. Embodiments of the present invention are not limited to the use of a particular size or shape of substrate, but may be particularly beneficial when used in combination with larger substrates.

Figure 4:
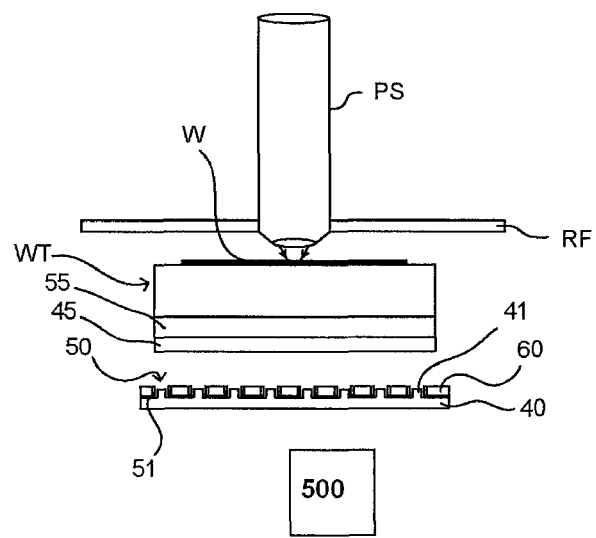
FIG. 4 depicts a lithographic apparatus according to an embodiment of the invention.

FIG. 4 depicts a lithographic apparatus according to an embodiment of the invention. The lithographic apparatus comprises a substrate table WT, a plurality of sensors 41, at least four actuators 51 and a controller 500. The substrate table WT is configured to support the substrate W.

Figure 7:
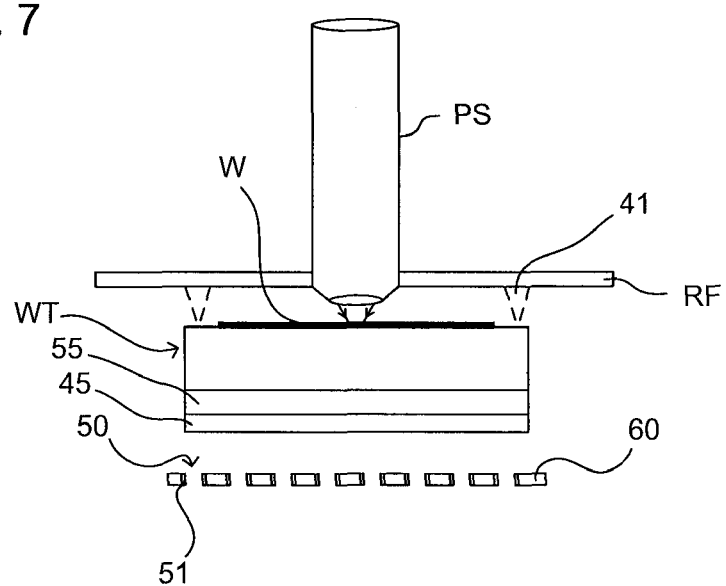
FIG. 7 depicts a lithographic apparatus according to an embodiment of the invention.

The plurality of sensors 41 are each configured to measure a deformation of the substrate table WT at a measurement location. In FIG. 4, the sensors 41 are positioned below the substrate table WT. However, this need not be the case. For example as depicted in FIG. 7, the sensors 41 may be positioned above the substrate table WT. In an embodiment the sensors 41 are disposed inside the substrate table WT.

At least one of the actuators 51 is configured to deform the substrate table WT, rather than merely changing the position of the substrate table WT. Deformation of the substrate table WT means that the shape of the substrate table WT changes, alternatively or in addition to the position or orientation of the substrate table WT being changed. In an embodiment the actuators 51 are configured to bend the substrate table WT.

In an embodiment, the apparatus comprises a plurality (for example three, or six) of actuators configured to change the position and/or orientation of the substrate table WT (but not deform the substrate table WT) and at least one actuator configured to deform the substrate table WT. In an embodiment, all of the actuators that are configured to change the position and/or orientation of the substrate table WT are further configured to deform the substrate table WT.

As mentioned above, the first positioner PM and the second positioner PW are configured to change the position of the substrate table WT. In an embodiment, the actuators 51 are further configured to change the orientation and/or position of the substrate table WT. The actuators 51 are further configured to move the substrate table WT throughout the X-Y plane and in the Z-direction. Here, the Z-direction means the vertical direction.

In an embodiment, the actuators 51 further perform the function of the second positioner PW mentioned above. In an embodiment the actuators 51 are in addition to the first positioner PM and the second positioner PW.

The controller 500 is configured to control the actuators 51 based on measurements made by the sensors 41. The controller 500 is configured to control the actuators 51 to deform the substrate table WT such that the substrate table WT has a desired shape.

The sensors 41 measure the deformation of the substrate table WT so as to determine the present shape of the substrate table WT. In an embodiment the controller 500 is configured to determine the shape of the substrate table WT based on the measurements made by the sensors 41. The controller 500 can then determine how the substrate table WT may be deformed in order to control the substrate table WT to have the desired shape. The controller 500 can then control the actuators 51 to deform the substrate table WT so as to arrive at the desired shape.

Hence, an embodiment of the present invention is a departure from the rigid body philosophy of a substrate table of a standard lithographic apparatus. According to the rigid body philosophy, the substrate table should be stiff in each of the X-, Y- and Z-directions. The purpose of this is to prevent the substrate table from bending. A purpose of preventing bending is to prevent the substrate table from undergoing undesirable deformations during use of the lithographic apparatus. This is because previously it has been very difficult to control the position of the substrate table, and in particular the exact position of the portion of the substrate that is being exposed, particularly when the substrate table undergoes undesirable deformations.

In particular, according to the rigid body philosophy, the substrate table is designed such that the vibration at the first eigenfrequency of the substrate table has a frequency of significantly more than 2 kHz. The purpose of this is to decrease possibility of movement (e.g. vibrations) of other components in the lithographic apparatus causing the substrate table to vibrate at such eigenfrequencies. Here, the first eigenfrequency is the lowest frequency at which vibration occurs. In an embodiment the first eigenfrequency corresponds to the first bending mode.

The first eigenfrequency can be increased by increasing the stiffness of the substrate table. This may be done by, for example, ensuring that the thickness of the substrate table, relative to the area of the substrate table, is more than or equal to a threshold thickness.

As mentioned above, larger substrates W have the benefit of having a greater usable area UA. The larger the substrate W, the larger the substrate table WT should be to support the substrate W. An embodiment of the present invention enables large substrate tables WT to be used, without requiring a corresponding increase in thickness that would be required to ensure its rigidity. This is beneficial because it avoids the mass of the substrate table WT increasing undesirably. By having a large substrate table WT with a low mass, the usable area UA of the substrate W can be large without compromising on the acceleration of the substrate table WT.

In an embodiment, the first eigenfrequency of the substrate table WT is less than or equal to about 2 kHz. Although such a low first eigenfrequency would have previously been problematic, an embodiment of the present invention allows this to be overcome by providing the actuators 51 that are configured to deform the substrate table WT to have a desired shape. Hence, the actuators 51 can compensate for any undesirable vibration of the substrate table WT. The actuators can reduce the effect of any such vibration and/or reduce the possibility of vibration occurring undesirably.

In an embodiment, the average vertical thickness of the substrate table WT is less than or equal to about 60 mm, and optionally less than or equal to about 50 mm. In an embodiment, the average vertical thickness of the substrate table WT is less than or equal to about 40 mm, optionally less than or equal to about 30 mm, and optionally about 10 mm. Hence, the substrate table WT can be relatively thin. A thin substrate table WT is more likely to be relatively flexible and is accordingly more likely to be deformed due to movement of other components in the lithographic apparatus during use of the lithographic apparatus. According to an embodiment of the invention, the actuators 51 can compensate for any such flexing of the substrate table WT by deforming the substrate table WT.

In an embodiment, the substrate table WT has an average diameter parallel to the plane of the substrate table WT of more than or equal to about 300 mm, and optionally more than or equal to about 400 mm. In an embodiment, the lithographic apparatus is used in combination with a substrate W that has a diameter of about 450 mm. In this case, the substrate table WT may have an average diameter in its plane of more than or equal to about 500 mm, and optionally more than or equal to about 600 mm. As the substrate table WT increases in size for a given force, the magnitude of deformation of the substrate table WT increases. Any undesirable deformation can be compensated for by the actuators 51 of embodiments of the present invention that deform the substrate table WT to have the desired shape.

In an embodiment, the controller 500 is configured to control the actuators 51 based on the measurements made by the plurality of sensors 41 so as to maintain the flatness of the substrate table WT. This is a purpose for the deformation of the substrate table WT by the actuators 51 of the embodiment of the invention. Accordingly, the substrate table WT can be flexible (i.e. not stiff) and the actuators can maintain a flat surface on which the substrate W is supported. This helps to position accurately the portion of the substrate W that is to be exposed in the lithographic apparatus.

In an embodiment, the actuators 51 are configured to deform the substrate table WT to have a desired shape such that the top surface of the substrate table is not flat, but has a target surface shape. Hence, according to an embodiment of the invention it is possible to deform intentionally the shape of the top surface of the substrate table WT. This may be done to control the substrate table WT such that the desired portion of the substrate W is irradiated by the beam of radiation at a desired level and angle. A target contour shape may be programmed into the controller 500.

Hence, the controller 500 is configured to control the actuators 51 to deform the substrate table WT so as to achieve the target contour shape at the top surface of the substrate table WT. Meanwhile, the plurality of sensors 41 measure the deformation of the substrate table WT so as to determine the current shape of the substrate table WT. Hence, the sensors 41 are part of a feedback loop that enables the controller 500 to control the shape of the substrate table WT.

For a given shape (e.g. substantially circular, substantially rectangular etc), the substrate table WT may undergo deformation according to known eigenmodes. The eigenmodes depend on the shape of the substrate table WT. An eigenmode is a vibrational mode of the substrate table WT. Each eigenmode is associated with a particular eigenfrequency at which resonance of that eigenmode is likely to occur. The eigenmodes and associated eigenfrequencies of a substrate table WT can be calculated and determined before use of the lithographic apparatus.

Vibrational flexing of the substrate table WT can be described in terms of a superposition of eigenmodes (having different amplitudes). In an embodiment, the sensors 41 are configured to measure a variation in deformation of the substrate table WT over time. In an embodiment the sensors 41 output the measurements to the controller 500. Based on this information, the controller 500 can control the actuators 51 to deform the substrate table WT so as to compensate for the vibrational modes.

Hence, in an embodiment the controller 500 is configured to control deformation of the substrate table WT in terms of at least one eigenmode. The controller 500 is configured to control the actuators 51 based on the characteristics of the at least one eigenmode. The characteristics may be the way in which the substrate table WT flexes according to that particular eigenmode.

In an embodiment, the actuators 51 are arranged in an array 50. The actuators 51 are distributed substantially evenly across a major surface of the substrate table WT. As depicted in FIG. 4, in an embodiment the actuators 51 are arranged in an array 50. The actuators 51 are distributed across the major surface of the base plate 60. The distribution of the actuators 51 is selected so as to maximize control and/or performance. In an embodiment the actuators 51 are distributed substantially evenly. In an embodiment, the density of actuators 51 per unit area is greater directly under the final lens of the projection system PS than elsewhere. The position of the actuators 51 overlaps the substrate table WT. In an embodiment, the actuators 51 are arranged across substantially the entire bottom surface of the substrate table WT.

The purpose of distributing the actuators 51 across the area of the substrate table WT is to reduce any undesirable deformation of the substrate table WT that is a side effect of driving the substrate table WT with the actuators 51 so as to move the position or orientation of the substrate table WT. In an embodiment, the lithographic apparatus comprises at least 16 actuators 51, at least 24 actuators 51 in an embodiment, at least 32 actuators 51 in another embodiment and at least 56 actuators 51 in an embodiment. Desirably, the larger the substrate table WT, the greater the number of actuators 51. With a larger number of actuators 51 the force exerted by each actuator 51 may be decreased. The greater the density of actuators 51 per unit area, the smaller the spatial frequency of control of the substrate table WT. A larger number of actuators 51 allows compensation for a higher order eigenmode.

The greater the number of positions on the surface of the substrate table WT via which the substrate table WT is driven (so as to change its position), the less the undesirable deformation of the shape of the substrate table WT as a side effect. Accordingly, in an embodiment the lithographic apparatus comprises at least 100 actuators 51. The greater the number and/or distribution of the actuators 51, the lesser the maximum strain within the substrate table WT underneath the substrate W.

In an embodiment actuators 51 are positioned at at least two edges of the substrate table WT. The actuators 51 may drive the substrate table WT in the X-Y direction at the edges of the substrate table WT and/or at positions within a major surface of the substrate table WT (away from the edges).

In an embodiment each actuator 51 comprises a coil 52. In an embodiment, the coil 52 is disposed within a base plate 60. The base plate 60 is below the substrate table WT.

Figure 5:
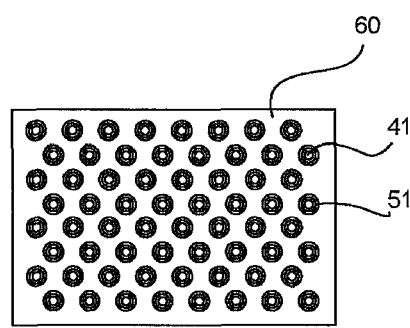
FIG. 5 depicts a plan view of a base plate of a lithographic apparatus according to an embodiment of the invention.

FIG. 5 depicts a plan view of the base plate 60. As can be seen in FIG. 5, the coils 52 corresponding to each actuator 51 are distributed throughout the base plate 60. The distribution may or may not be uniform.

In an embodiment, the substrate table WT comprises a magnet array 55. The magnet array 55 forms part of the actuation system for actuating the substrate table WT. The actuators 51, each comprising a coil 52, can deform the substrate table WT by providing a force to a portion of the magnet array 55. The magnet array 55 is integral to the substrate table WT. In an embodiment the magnet array 55 comprises a Halbach array.

As depicted in FIG. 4, the plurality of sensors 41 may be comprised in a sensor array 40. In an embodiment, the sensor array 40 is linked to a reference frame RF above the substrate table WT. The sensors 41 comprised in the sensor array 40 are each configured to measure the vertical height of the substrate table WI at a measurement location. This enables non-rigid body control of the substrate table WT via the use of the actuators 51.

Any suitable sensor 41 can be used in embodiments of the invention. In an embodiment, the plurality of sensors 41 each comprise a capacitance sensor. However, other types of sensors could be used in addition to a capacitance sensor, or as an alternative to a capacitance sensor. For example, the sensors 41 could be a laser interferometer sensor, or an encoder sensor, for example. In an embodiment the sensors 41 comprise a focal sensor array. As mentioned above, in an embodiment the flatness of the substrate table WT is maintained by the sensors 41 and the actuators 51. Hence, the tilt of an X-Y plane encoder can be controlled.

In an embodiment, each sensor 41 is configured to sense the deformation of the substrate table WT at the measurement location via a signal that travels between the measurement location and the sensor 41 through the coil 52 of one of the actuators 51. In an embodiment, the sensor array 40 is positioned below the base plate 60. In an embodiment, the sensors 41 are disposed at least partly within the base plate 60. Hence, the sensor array 41 "looks" through the base plate 60, where all the coils 52 are located.

In an embodiment, the base plate 60 is fixed on a pedestal or an external balance mass. In an embodiment, the pedestal or external balance mass moves only a small amount or not at all, for example less than 1 mm during use of the lithographic apparatus. This allows the sensors 41 to look through the base plate 60 during use of the lithographic apparatus.

Figure 6:
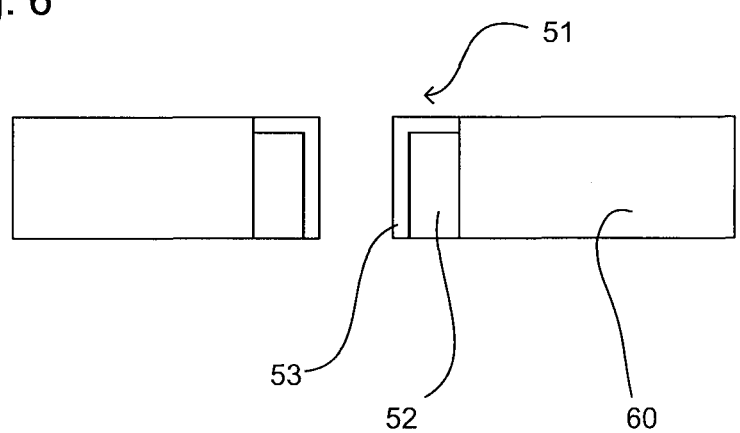
FIG. 6 depicts a cross sectional side view of one of the actuators of a lithographic apparatus according to an embodiment of the invention.

FIG. 6 depicts a cross sectional side view of one of the actuators 51. The actuator comprises a coil 52. In an embodiment, the actuator 51 comprises a cooling plate 53. The cooling plate may be disposed on an inner surface of the coil 52.

With the arrangement depicted in FIGS. 4-6, the plurality of sensors 41 are each configured to measure the deformation at a bottom surface of the substrate table WT via a signal that is transmitted below the substrate table WT. Hence, the sensors 41 may be configured to measure the vertical height of the bottom surface of the substrate table WT.

As depicted in FIG. 4, the substrate table WT may comprise a reflective surface 45 at its bottom surface. Hence, its bottom surface of the substrate table WT may be reflective so as to reflect a signal from the plurality of sensors 41. In an embodiment the reflective surface 45 comprises a two-dimensional grating.

In the case that the sensor array 40 is positioned below the substrate table WT, the sensor array 40 may comprise a fiber-based focus sensing array. In an embodiment the fiber-based array comprises a fiber based Fabry Perot interferometer comprising a single-mode fiber mounted into a fiber probe and a sensing element. The space between fiber and reflecting surface is called cavity length. The reflected light is modulated in accordance with the cavity length. In an embodiment the fiber-based array comprises an array of transmit fibers that transmit radiation, a target and an array of receive fibers that capture radiation. The radiation exits the transmit fibers at the tip of a probe, is incident on a target, is captured by the receive fibers and transmitted to the probe. The monitored intensity is proportional to the distance between the probe tip and the target. In an embodiment, the sensor array 40 may perform fiber based angular measurements. In an embodiment, the sensor array 40 comprises an inductive sensor array and/or an acoustical sensor array.

A benefit of measuring the deformation of the substrate table WT using a plurality of sensors 41 positioned below the substrate table WT is that it is possible to measure the deformation of the substrate table at the optical axis of the lithographic apparatus without undesirably interfering with the projection system PS of the lithographic apparatus. It is desirable to measure the deformation of the substrate table WT at the optical axis because it is at this point that the substrate W is exposed. Hence, a measure of the vertical height of the substrate table WT at the optical axis is representative of the vertical position of the die on the substrate W to be exposed. This is helpful to control the focus of the system.

Hence, in an embodiment at least one of the plurality of sensors 41 measures the deformation of the substrate table WT at the optical axis of a projection system PS of the lithographic apparatus. In an embodiment at least one of the plurality of sensors measures the deformation of the substrate table WT off the optical axis of a projection system PS of the lithographic apparatus. The at least one of the plurality of sensors 41 measures the deformation of the substrate table WT with respect to a projection system PS and/or a reference frame RF of the lithographic apparatus.

However, the sensor array 40 does not have to be below the substrate table WI, or sense deformation of the substrate table WT via signals that are transmitted below the substrate table WT. FIG. 7 depicts a lithographic apparatus according to an embodiment of the invention. As depicted in FIG. 7, the lithographic apparatus may comprise a reference frame RF positioned above the substrate table WT. The sensor array 40 may be attached to the reference frame RF. In an embodiment, each of the sensors 41 comprises an encoder sensor configured to detect the position of the substrate table WT via an encoder grating. Additionally or alternatively, the sensor array 41 may comprise at least one interferometer sensor, such as a surface interferometer.

As depicted in FIG. 7, the sensor array 40 may be configured to measure the deformation at the top surface of the substrate table WT. Additionally or alternatively to an interferometer sensor and an encoder sensor, the sensor array 40 may comprise a fiber-based focus sensing array, and/or an optical image sensor array.

In an embodiment the plurality of sensors 41 are each configured to measure the deformation of the substrate table WT via a signal that is transmitted within the substrate table WT. Hence, the sensors 41 may perform an internal measurement inside the substrate table WT.

Using an internal measurement system, the sensor array 40 may comprise a capacitance sensor array, a shielded inductive sensor array, interferometer sensors and/or grating sensors.

In an embodiment, the plurality of sensors are each configured to measure the deformation via a signal that corresponds to a deformation of the sensor 41 within the substrate table WT. The sensors 41 may each comprise a fiber Bragg grating and/or a piezoelectric element. As the substrate table WT undergoes deformation, the sensor 41 within the substrate table WT also undergoes a deformation. The deformation of the sensor (e.g. piezoelectric element) is representative of the deformation of the substrate table WT. In this way, it is possible to measure the deformation of the substrate table WT at the optical axis.

In an embodiment the lithographic apparatus has a long stroke and short stroke configuration for moving the substrate table WT. In an embodiment the actuation of the substrate table WT in the X-Y plane is provided by a long stroke stage. The short stroke stage, which is surrounded by the long stroke stage, provides vertical force to the substrate table WI so as to compensate for the force of gravity. The short stroke stage further performs fine positioning in six degrees of freedom. In an embodiment the short stroke stage comprises the substrate table WT.

In an embodiment, a substrate table WT comprises a substrate clamping mechanism. The substrate clamping mechanism may comprise an electrostatic clamp and/or a vacuum clamp. In the case of an extreme ultraviolet lithographic apparatus, an electrostatic clamp is beneficial because it can be used in an environment that is at a very low pressure.

As will be appreciated, any of the above described features can be used with any other feature and it is not only those combinations explicitly described which are covered in this application.

In an embodiment there is provided a lithographic apparatus, comprising a projection system PS, a substrate table WT, a plurality of sensors 41, at least one actuator 51 and a controller 500. The projection system PS is for projecting a patterned beam of radiation onto a substrate W. The substrate table WT is configured to support the substrate W and to move relative to the projection system PS. The plurality of sensors 41 is configured to measure a deformation of the substrate table WT. The at least one actuator 51 is configured to deform the substrate table WT. The controller 500 is configured to control the actuator to deform the substrate table WT based on measurements made by the sensors 41. The plurality of sensors 41 are located on a first side of the substrate table opposite to a second side of the substrate table facing the projection system PS. The plurality of sensors 41 are substantially stationary relative to the projection system PS.

The first side of the substrate table may be below the substrate table. The second side may be above the top side of the substrate table holding the substrate. The sensors may be located on a base plate, a pedestal or an external balance mass. Compared to the movement of the substrate table, the movement a base plate, a pedestal or balance mass is limited, in the range of 0-10 cm, e.g. no more than 5 cm, 1 cm, 5 mm, 1 mm. The sensors are therefore substantially stationary relative to the projection system PS. Having the stationary sensors reduces the dynamical disturbance of wires to the sensors.

At least one of the sensors may be located at the optical axis of the projection system. This way the deformation of the part of the substrate table closest to target portion C can be measured. This allows an accurate amount of deformation by the actuator at the location where the pattern is being projected. This may improve the quality of the projected pattern.

Although specific reference may be made in this text to the use of lithographic apparatus in the manufacture of ICs, it should be understood that the lithographic apparatus described herein may have other applications in manufacturing components with microscale, or even nanoscale features, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm) and extreme ultraviolet (EUV) radiation (e.g. having a wavelength in the range of from 5 to 20 nm).

The term "lens", where the context allows, may refer to any one or combination of various types of optical components, including refractive and reflective optical components.

While specific embodiments of the invention have been described above, it will be appreciated that the invention may be practiced otherwise than as described. For example, the embodiments of the invention may take the form of a computer program containing one or more sequences of machine-readable instructions describing a method as disclosed above, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

The controllers described above may have any suitable configuration for receiving, processing, and sending signals. For example, each controller may include one or more processors for executing the computer programs that include machine-readable instructions for the methods described above. The controllers may also include data storage medium for storing such computer programs, and/or hardware to receive such medium.

The descriptions above are intended to be illustrative, not limiting. Thus, it will be apparent to one skilled in the art that modifications may be made to the invention as described without departing from the scope of the claims set out below.

The invention claimed is:

1. A lithographic apparatus, comprising:
    a projection system configured to project a patterned beam of radiation onto a substrate;
    a substrate table configured to support the substrate and to move relative to the projection system;
    a plurality of sensors configured to measure a deformation of the substrate table;
    an actuator configured to deform the substrate table; and
    a controller configured to control the actuator to deform the substrate table based on measurements made by the sensors,
    wherein the plurality of sensors is located on a first side of the substrate table opposite to a second side of the substrate table facing the projection system,
    wherein the plurality of sensors is substantially stationary relative to the projection system,
    wherein at least one of the plurality of sensors is located at an optical axis of the projection system.

2. The lithographic apparatus of claim 1, wherein the controller is configured to control the actuator based on the measurements made by the plurality of sensors so as to maintain the flatness of the substrate table.

3. The lithographic apparatus of claim 1, comprising a plurality of actuators, wherein the actuators are comprised in an array and are distributed substantially evenly across a major surface of the substrate table.

4. The lithographic apparatus of claim 1, wherein each actuator comprises a coil, optionally disposed within a base plate located on the first side.

5. The lithographic apparatus of claim 4, wherein each sensor is configured to sense the deformation of the substrate table at a measurement location via a signal that, in use, travels between the measurement location and the sensor through the coil of one of the actuators.

6. The lithographic apparatus of claim 1, wherein the plurality of sensors are each configured to measure the deformation of a surface of the substrate table at the first side via a signal that, in use, is transmitted at the first side of the substrate table.

7. The lithographic apparatus of claim 6, wherein the surface of the substrate table at the first side is reflective so as to reflect a signal from the plurality of sensors.

8. The lithographic apparatus of claim 1, wherein the plurality of sensors are each configured to measure the deformation via a signal that, in use, is transmitted within the substrate table.

9. The lithographic apparatus of claim 1, wherein the plurality of sensors are each configured to measure the deformation via a signal that corresponds to a deformation of the sensor within the substrate table.

10. The lithographic apparatus of claim 1, wherein the plurality of sensors each comprise a capacitance sensor.

11. The lithographic apparatus of claim 1, wherein at least two actuators are positioned at edges of the substrate table.

12. The lithographic apparatus of claim 1, wherein an average vertical thickness of the substrate table is less than or equal to about 60 mm.

13. The lithographic apparatus of claim 12, wherein the average vertical thickness is less than or equal to about 50 mm.

14. The lithographic apparatus of claim 1, wherein an average horizontal diameter of the substrate table is more than or equal to about 300 mm.

15. The lithographic apparatus of claim 14, wherein the average horizontal diameter is more than or equal to about 450 mm.

16. A lithographic apparatus, comprising:
a projection system configured to project a patterned beam of radiation onto a substrate;
a substrate table configured to support the substrate and to move relative to the projection system;
a plurality of sensors configured to measure a deformation of the substrate table;
an actuator configured to deform the substrate table; and
a controller configured to control the actuator to deform the substrate table based on measurements made by the sensors,
wherein the plurality of sensors is located on a first side of the substrate table opposite to a second side of the substrate table facing the projection system, and
wherein the plurality of sensors is substantially stationary relative to the projection system, wherein the controller is configured to calculate deformation of the substrate table in terms of at least one eigenmode, and the controller is configured to control the actuator based on characteristics of the at least one eigenmode.

17. A lithographic apparatus, comprising:
a projection system configured to project a patterned beam of radiation onto a substrate;
a substrate table configured to support the substrate and to move relative to the projection system;
a plurality of sensors configured to measure a deformation of the substrate table;
an actuator configured to deform the substrate table; and
a controller configured to control the actuator to deform the substrate table based on measurements made by the sensors,
wherein the plurality of sensors is located on a first side of the substrate table opposite to a second side of the substrate table facing the projection system, and
wherein a first eigenfrequency at which vibration of the substrate table occurs is less than or equal to about 2 kHz.

18. A method of deforming a substrate table of a lithographic apparatus, the method comprising:
measuring a deformation of the substrate table, using a plurality of sensors, at a plurality of measurement locations located on a first side of the substrate table opposite to a second side facing a projection system, the plurality of measurement locations being substantially stationary relative to the projection system; and
controlling at least one actuator based on said measurements to deform the substrate table,
wherein at least one of the plurality of sensors is located at an optical axis of the projection system.

19. A device manufacturing method, comprising:
projecting a patterned beam of radiation onto successive substrates supported by at least one substrate table with a lithographic apparatus; and
deforming the substrate table during the use of the lithographic apparatus with the method of claim 18.

* * * * *